(12) United States Patent
McMullen et al.

(10) Patent No.: US 6,324,070 B1
(45) Date of Patent: Nov. 27, 2001

(54) SERVICE ACCESS FOR A SCANNER

(75) Inventors: Robert McMullen, Fairport, NY (US); Thomas Wetzel; Steven Bailey, both of Rochester, PA (US); Woogie Son, Penfield, NY (US)

(73) Assignee: Heidelberg Digital L.L.C., Rochester, NY (US)

( * ) Notice: Subject to any disclaimer, the term of this patent is extended or adjusted under 35 U.S.C. 154(b) by 0 days.

(21) Appl. No.: 09/572,101

(22) Filed: May 17, 2000

(51) Int. Cl.$^7$ ............................... H05K 1/11; H05K 1/14
(52) U.S. Cl. .................... 361/784; 361/760; 235/470; 235/375
(58) Field of Search ................................ 361/784, 719, 361/720, 736, 748, 760, 704, 695, 462, 790, 803; 235/472, 462.01, 470, 384, 375

(56) References Cited

U.S. PATENT DOCUMENTS

| | | | |
|---|---|---|---|
| 4,460,120 | * 7/1984 | Shepard et al. | 235/472 |
| 5,068,601 | 11/1991 | Parmenter . | |
| 5,297,025 | * 3/1994 | Shoquist et al. | 361/704 |
| 5,552,592 | * 9/1996 | Dvorkis et al. | 235/462 |
| 5,604,871 | * 2/1997 | Pecone | 395/281 |
| 5,699,494 | 12/1997 | Colbert et al. | 395/114 |
| 5,751,550 | * 5/1998 | Korinsky | 361/695 |
| 5,793,616 | * 8/1998 | Aubuchon et al. | 361/784 |
| 5,883,373 | 3/1999 | Swartz . | |
| 5,946,461 | 8/1999 | Landry et al. | 395/117 |
| 6,026,258 | 2/2000 | Fresk et al. | 399/87 |
| 6,050,491 | * 4/2000 | Shepard et al. | 235/472.02 |
| 6,056,200 | * 5/2000 | Dvorkis et al. | 235/472 |

OTHER PUBLICATIONS

Manual, "Adobe® Portable Document Formal Reference Manual, Version 1.3," pp. 2–518.
"Adobe® Acrobat 4.0 Guide," pp. 1–595.
Brochure, "Quite Imposing Plus Online Guide 1.2."
Brochure, "W3C Extensible Markup Language (SML) 1.0," W3C Recommendation Feb. 10, 1998, pp. 1–32.
Brochure, "StampPDF™ Users Guide—An Acrobat Plugin," pp. 6–82, ©1999 Digital Applications, Inc.
Brochure, "TIFF™ Revision 6.0" Specification, pp. 4–120.
Manual, "TWAIN Specification Version 1.8," pp. 1–516.
Manual, "Open Document Management API, Version 2.0," pp. 1–87.
Brochure Guide, "Network Imaging System Interface Development Guide, Release 2," pp. 1–1–6–4.
Dan Phelps and John Thompson, "Rendering For Electronic Printers and Copiers," pp. 1–72.
Kodak Publication NO. FN9074 5/85;13 "Fundamentals of Digital Copiers—Revision 1," pp. 1–49.

* cited by examiner

*Primary Examiner*—Jeffrey Gaffin
*Assistant Examiner*—Hung Bui

(57) ABSTRACT

A scanner having a serviceable circuit board assembly with a stair-stepping configuration. The scanner has a card cage for mounting circuit boards in the rear of the scanner. The card cage has an access opening. A first circuit board and a second circuit board are mounted inside the card cage. The first circuit board forms a notch. The second circuit board has a viewable portion that is viewable and accessible through the access opening and the notch. The test points and light emitting diodes are positioned within the viewable portion of the second circuit board.

24 Claims, 6 Drawing Sheets

SERVICE ACCESS FOR A SCANNER

FIELD OF THE INVENTION

This invention relates generally to document scanner systems. More particularly, this invention relates to production document scanners having circuit board assemblies.

BACKGROUND OF THE INVENTION

A typical production document scanner system has a scanner and a scanner host workstation with a scanner user interface. The scanner is installed on a table adjacent or in close proximity to the scanner host station. The scanner weighs on the order of 200 pounds. When installed, the back of the scanner usually is positioned against a wall, thus limiting any access to the rear of the scanner.

The control circuitry of most scanner designs is located in the rear of the scanner. The control circuitry includes electrical test points and light emitting diode (LED) status indicators. With the scanner against the wall, it is virtually impossible to view and access the test points and LED indicators. To provide service, the scanner must be moved. This situation is compounded because the scanner usually needs to be shifted multiple times during a diagnostic procedure to gain access to key electrical components.

To further complicate matters, recent scanner designs now have horizontal circuit boards. While horizontal circuit boards reduce the size of the scanner, they further limit the access and view of the LED indicators and test points. Even if the circuit boards were vertical, the overlapping nature of circuit board assemblies makes it difficult to view and access test points and LED indicators on circuit boards "obstructed" by another circuit board.

Accordingly, there is a need for a scanner permitting diagnostic test points and LED status indicators to be viewed and accessed without moving the scanner.

BRIEF SUMMARY OF THE INVENTION

The present invention provides a scanner having a serviceable circuit board assembly. The scanner permits the diagnostic testing of test points and light emitting diodes from the same external location without moving the scanner. The diagnostic testing may be done from the front or sides of the scanner.

The scanner has a card cage for mounting circuit boards in the rear of the scanner. The card cage has an access opening. A first circuit board and a second circuit board are mounted inside the card cage. The first circuit board forms a notch. The second circuit board has a viewable portion that is viewable and accessible through the access opening and the notch. The test points and light emitting diodes are positioned within the viewable portion of the second circuit board. The test points are accessible for connection to a test probe. The combination of the notch on the first circuit board and the viewable portion on the second circuit board creates a stair-stepping configuration that is applicable to assemblies having more than two circuit boards.

The following drawings and description set forth additional advantages and benefits of the invention. More advantages and benefits are obvious from the description and may be learned by practice of the invention.

BRIEF DESCRIPTION OF SEVERAL VIEWS OF THE DRAWINGS

The present invention may be better understood when read in connection with the accompanying drawings, of which.

DETAILED DESCRIPTION OF THE INVENTION

Figure 1:
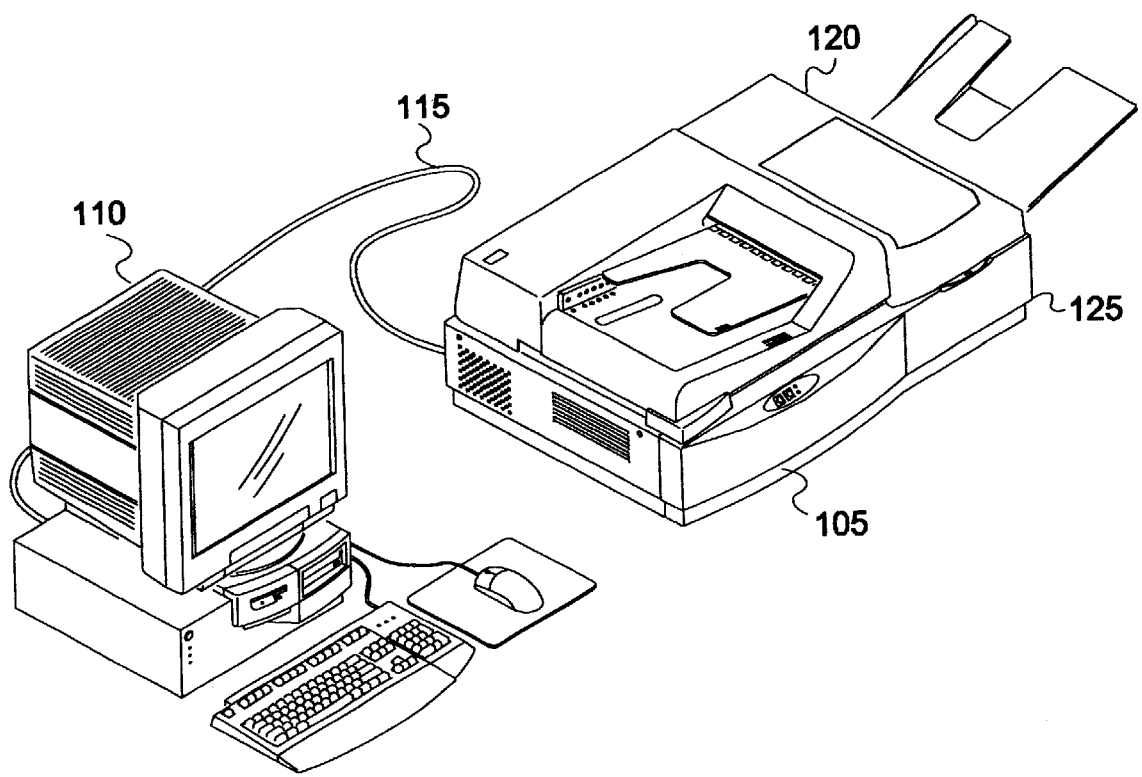
FIG. 1 shows a perspective view of a production document scanner system having a scanner according to a preferred embodiment of the present invention.

FIG. 1 shows a production document scanner system 100 having a scanner 105 according to the present invention. A small computer system interface (SCSI) cable 115 connects the scanner 105 to a scanner host workstation 110, having a scanner user interface. The scanner host workstation 110 may be a personal computer or other microprocessor-based system. The scanner 105 has an automatic document feeder 120 operatively connected and mounted on top of a scanner cabinet 125.

Figure 2:
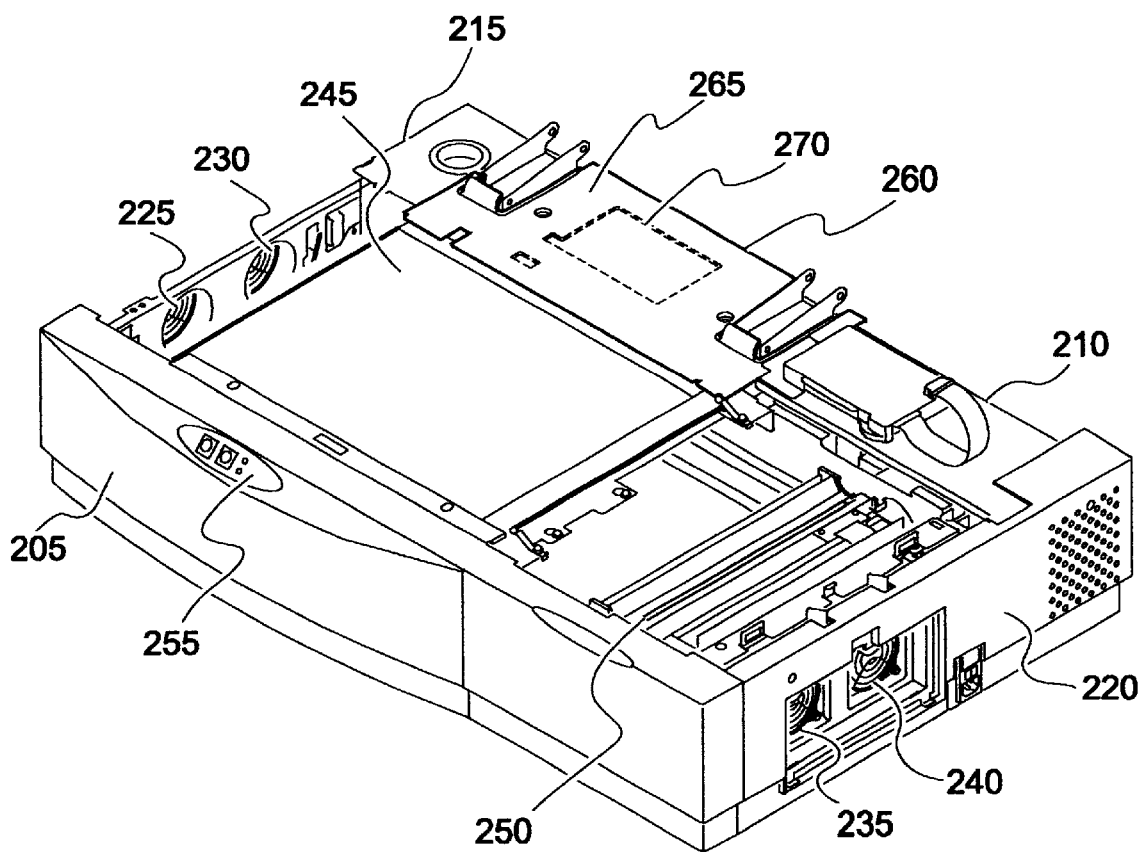
FIG. 2 shows a front perspective view of a scanner without an automatic document feeder according to a preferred embodiment of the present invention.

FIG. 2 shows the scanner cabinet 125, without the automatic document feeder 120. The scanner cabinet has a front 205, a rear 210, a left side 215, and a right side 220. Disposed along the left side 215 are the left front fan 225 and the left rear fan 230. Disposed along the right side 220 are the right front fan 235 and the right rear fan 240. The fans 225, 230, 235, 240 operate whenever the scanner 105 is operating to provide cooling airflow throughout the scanner cabinet 125.

A platen glass 245 and an illumination lamp 250 are set inside the scanner cabinet 125. The illumination lamp 250 is operatively disposed adjacent to the platen glass 245. The platen glass 245 is positioned so documents may be placed on the platen glass 245 for scanning. The platen glass 245 is positioned for operation with the automatic document feeder 120.

A display board 255 is positioned on the front 205 of the scanner cabinet 125. The display board 255 has start and stop switches along with scanner status light emitting diodes.

A circuit board assembly or card cage 260 is located near the center of the rear 210 and underneath a top frame cover 265 of the scanner cabinet 125. The top frame cover 265 covers an access opening 270. The card cage 260 contains the electronic circuitry providing the main control functions for the scanner 120. This electronic circuitry includes circuit boards (not shown) electrically connected by wire harnesses (not shown) to the fans 225, 230, 235, 240, the illumination lamp 250, the display board 255, and other electrical components (not shown) in the scanner 120. The access opening 270 leads to the circuit boards (not shown) in the card cage 260. The top frame cover 265 slides to open the access opening 270.

Figure 3:
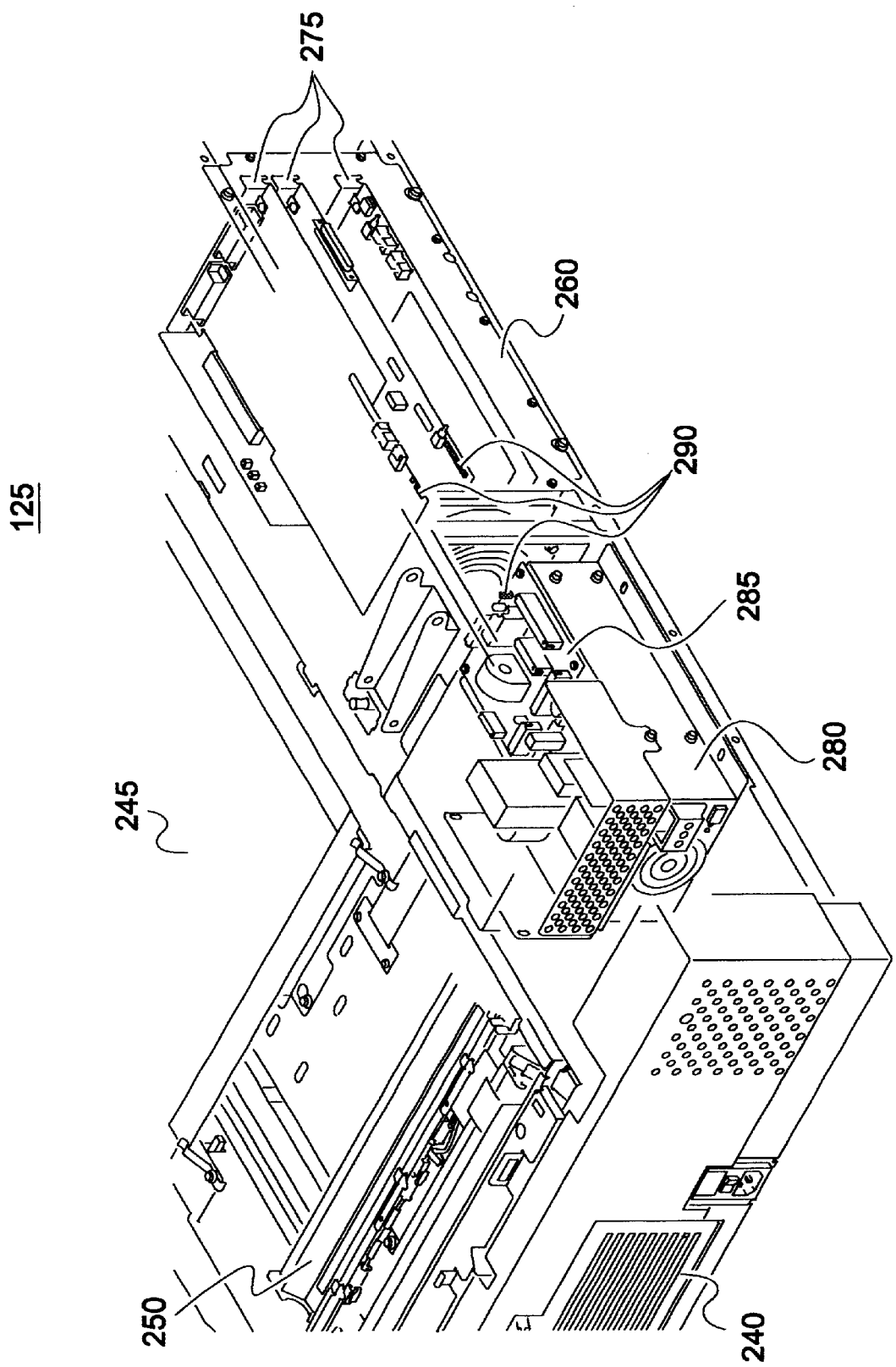
FIG. 3 shows a rear perspective view of a scanner according to a preferred embodiment of the present invention.

FIG. 3 shows a close-up rear view of the scanner cabinet 125. The top frame cover 265 and other portions of the scanner cabinet 125 are removed to show inside the card cage 260. Several circuit boards 275 are disposed inside the card cage 260. A power module 280 is positioned adjacent to the card cage 260 at the rear 210 of the scanner cabinet 125. The power module 280 has a DC voltage distribution board 285 for providing DC voltage to the circuit boards 285 and other electric components of the scanner 120. The circuit boards 275 and voltage distribution board 285 have status light emitting diodes 290.

Figure 4:
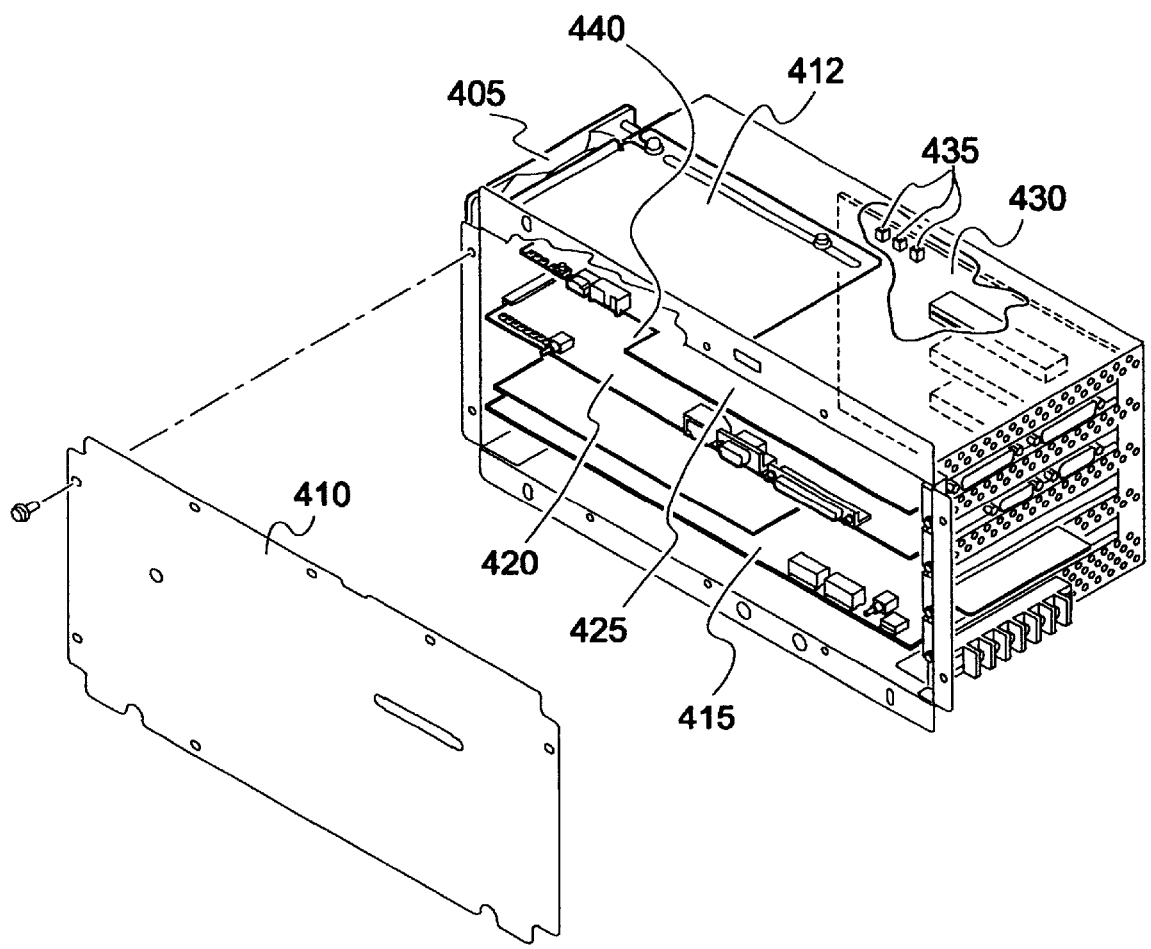
FIG. 4 shows a perspective view of a card cage for a scanner according to a preferred embodiment of the present invention.

FIG. 4 shows a close-up view of the card cage 260 having a card cage fan 405, a card cage rear cover 410, and a card cage access cover 412. The card cage 260 is constructed of sheet metal and provides a mounting structure and EMI shielding for several circuit boards. An image processing board 415 is positioned substantially horizontal near the bottom of the card cage 260. A central processing unit (CPU) board 420 is placed substantially horizontal above the image processing board 415. Similarly, a motion control board 425 is placed substantially horizontal above the CPU board 420.

A vertically mounted backplane board 430 interconnects the image processing board 415, the CPU board 420, and the motion control board 425. The backplane board 430 has backplane light emitting diodes 435, which are viewable through access holes 440 in the card cage 260. The access holes may be designed in such away as to permit the backplane light emitting diodes to be viewed from the front of the scanner 120. The horizontal circuit boards have status indicators or light emitting diodes 445 and test points (not shown) for servicing the scanner 120.

The test points allow control signals for each scanner component to be monitored. While other designs may be used, the test points have small pins arranged in rows protruding vertically from each of the circuit boards. Voltage measurements are made using a test probe (not shown), integrated into the design of the motion control board 425. Through the test probe, an electrical connection may be made with the various test points. Measurements are obtained by connecting a digital multimeter to standard test connectors (not shown). These test point connectors provide electrical connections to ground and the test probe. In practice, the multimeter connection points are not changed during a diagnostic procedure. Instead, the test probe is used to connect to various test points on the circuit boards. The resulting voltages are viewed on the multimeter.

Figure 5:
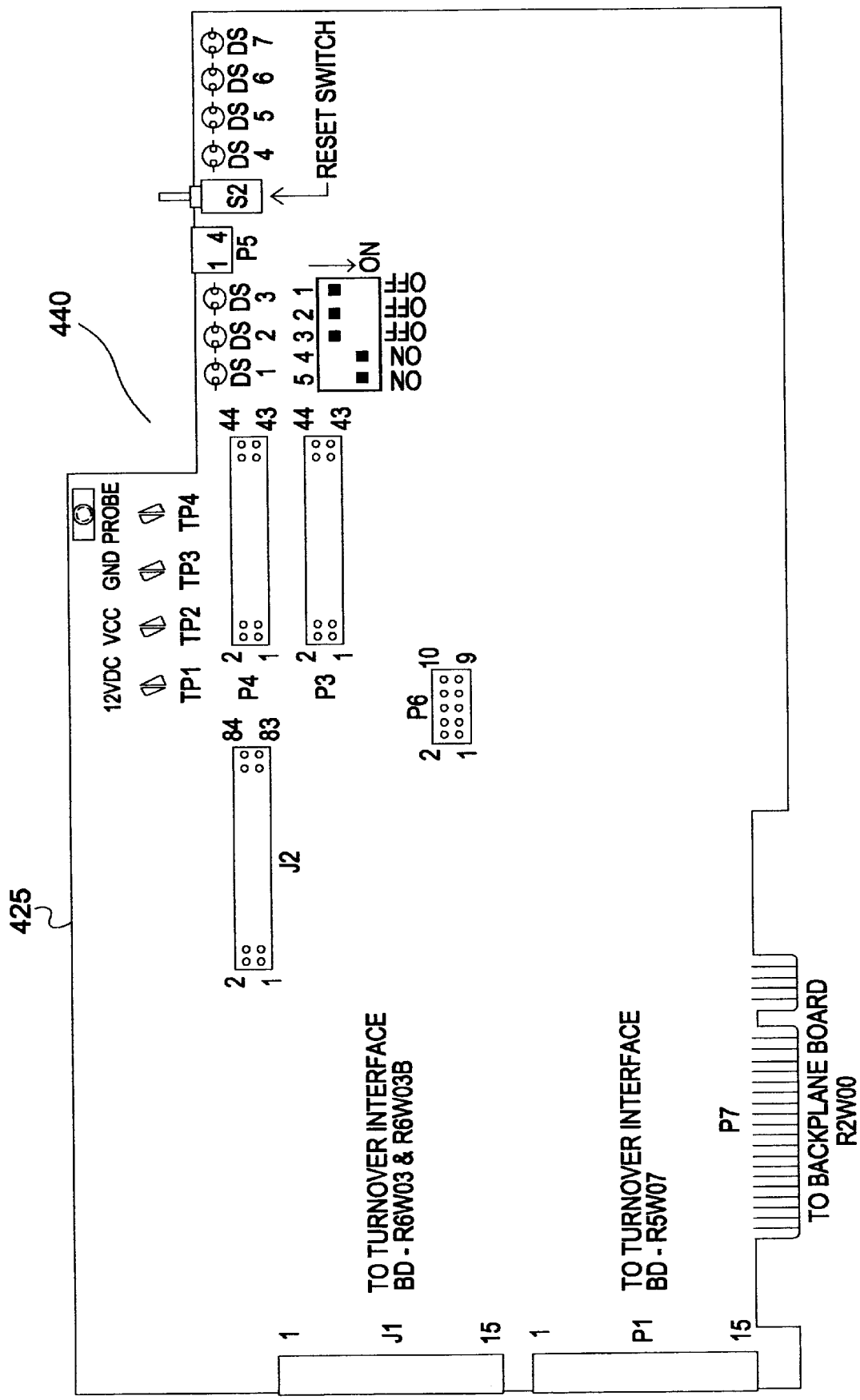
FIG. 5 shows a top view of a motion control circuit board for the card cage shown in FIG. 4.
Figure 6:
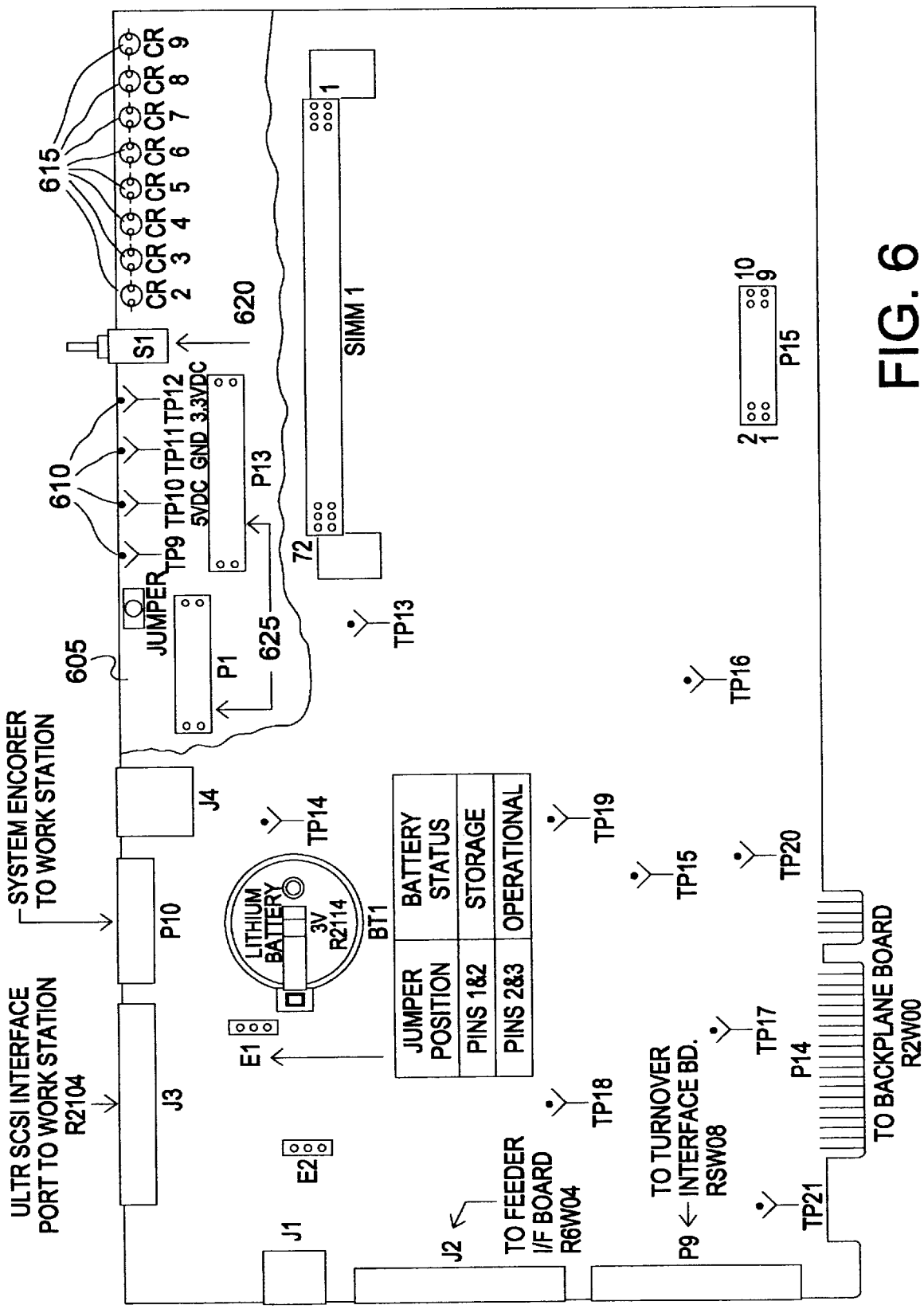
FIG. 6 shows a top view of a central processing unit (CPU) circuit board for the card cage shown in FIG. 4.

The motion control board 425 has a strategically located notch 440 for forming a stair-stepping configuration with the CPU board 420. FIG. 5 shows a top view of the motion control board 425 showing notch 440. When the motion control bard 425 and CPU board 420 are placed in the card cage 260, the notch 440 exposes a portion of the CPU board 420 for viewing through the access opening 270. FIG. 6 shows a top view of CPU board 420 having a viewable portion 605. The viewable portion 605 is the area of the CPU board 420 exposed by the notch 440 on the motion control board 425. The viewable portion 605 includes test points 610, CPU light emitting diodes 615, reset switch 620, and testpoint headers 625. It is this combination of the notch 440 and the viewable portion 605 that creates the stair-stepping configuration.

The stair-stepping configuration permits access to the light emitting diodes and test points in the card cage 260. Access is gained by removing the top frame cover 265 to expose the card cage access cover 412, which slides open. Once opened, the light emitting diodes and test points on the various circuit boards are simultaneously viewable and accessible through the access opening 270, thus permitting service of the scanner 120 from the front 205.

While particular shapes and proportions are shown for the notch 440 and viewable portion 605, it is known the notch 440 and viewable portion 605 may have other shapes and proportions. The notch 440 and viewable portion 605 may extend the entire length or width of their respective circuit boards.

In addition, the stair-stepping configuration may extend for more than the two boards shown. For example, the CPU board 420 may have its own notch (not shown) for exposing a viewable portion of the image processing board 415. The CPU board notch and the motion control board notch would be aligned to permit an unobstructed view of the viewable portion on the image processing board. Even more boards may be used. The area of the boards closer to the access opening would decrease. However, the stair-stepping configuration provides access and views of the viewable portion on each board, thus enabling diagnostic testing of each board from the same external location.

While these particular circuit boards are shown in this particular arrangement, it is known that other circuit boards and arrangements may be used. The notch may be used on vertically disposed circuit boards and may have a vertically located access cover and opening. Other configurations and arrangements are known from use of the invention.

While the invention has been described an illustrated, this description is by way of example only. Additional advantages will occur readily to those skilled in the art, who may make numerous changes without departing from the true spirit and scope of the invention. Therefore, the invention is not limited to the specific details, representative devices, and illustrated examples in this description. Accordingly, the scope of this invention is to be limited only as necessitated by the accompanying claims.

We claim:

1. A scanner comprising:
    a circuit board assembly;
    a first circuit board forming a notch; and
    a second circuit board electrically connected to the first circuit board, the second circuit board having a viewable portion;
    wherein the first and second circuit boards are positioned within the circuit board assembly,
    wherein the circuit board assembly forms an access opening,
    wherein the viewable portion is viewable and accessible for diagnostic testing through the notch,
    wherein the viewable portion is viewable and accessible for diagnostic testing through the access opening.

2. A scanner according to claim 1, wherein the second circuit board has at least one status indicator located within the viewable portion.

3. A scanner according to claim 2, wherein the at least one status indicator is a light emitting diode.

4. A scanner according to claim 2, wherein the second circuit board has at least one test point located within the viewable portion.

5. A scanner according to claim 1, wherein the second circuit board has at least one test point located within the viewable portion.

6. A scanner according to claim 5, wherein the at least one test point is accessible for diagnostic testing for connection with a test probe.

7. A scanner having a serviceable circuit board assembly, the scanner comprising:
    a card cage for mounting circuit boards, wherein the card cage forms an access opening;
    a first circuit board positioned in the card cage, wherein the first circuit board forms a first notch;

a second circuit board positioned in the card cage adjacent to the first circuit board, the second circuit board having a first viewable portion; and wherein the first viewable portion is viewable and accessible for diagnostic testing through the access opening and the first notch.

8. A scanner according to claim 7, wherein the first and second circuit boards are horizontal.

9. A scanner according to claim 7, wherein the second circuit board has at least one light emitting diode within the first viewable portion.

10. A scanner according to claim 7, wherein the second circuit board has at least one test point located within the first viewable portion.

11. A scanner according to claim 7, further comprising:

a third circuit board positioned in the card cage adjacent to the second circuit board, the third circuit board having a second viewable portion, wherein the second circuit board forms a second notch;

wherein the second viewable portion is viewable and accessible for diagnostic testing through the access opening, the first notch, and the second notch.

12. A scanner according to claim 11, wherein the first circuit board, the second circuit board, and the third circuit board are horizontal.

13. A scanner according to claim 11, wherein the second circuit board has a first light emitting diode within the first viewable portion, and the third circuit board has a second light emitting diode within the second viewable portion.

14. A scanner according to claim 11, wherein the second circuit board has a first test point within the first viewable portion, and the third circuit board has a second test point within the second viewable portion.

15. A scanner according to claim 14, wherein the first test point and the second test point are accessible for diagnostic testing with a test probe.

16. A production document scanner system, comprising:

a scanner host workstation having a scanner user interface; and a scanner connected to the scanner host workstation, wherein the scanner has, a card cage for mounting circuit boards, wherein the card cage forms an access opening, a first circuit board positioned in the card cage, wherein the first circuit board forms a notch, a second circuit board positioned in the card cage adjacent to the first circuit board, the second circuit board having a viewable portion, and wherein the viewable portion is viewable and accessible for diagnostic testing through the access opening and the notch.

17. A scanner according to claim 16, wherein the first and second circuit boards are horizontal.

18. A scanner according to claim 16, wherein the second circuit board has at least one light emitting diode within the viewable portion.

19. A scanner according to claim 18, wherein the second circuit board has at least one test point located within the viewable portion.

20. A scanner according to claim 16, wherein the second circuit board has at least one test point located within the viewable portion.

21. A scanner according to claim 19, wherein the at least one test point is accessible for diagnostic testing with a test probe.

22. A scanner comprising:

a cabinet forming an access opening;

a circuit board assembly disposed within the cabinet, the circuit board assembly comprising at least two circuit boards having a stair-stepping configuration, wherein at least one of the at least two circuit boards forms a notch, wherein at least another of the at least two circuit boards has a viewable portion;

wherein the viewable portion is viewable and accessible for diagnostic testing through the notch and the access opening.

23. A scanner according to claim 22, wherein at least one of a status indicator and a test point is located within the viewable portion.

24. A scanner according to claim 22, wherein at least one control signal is monitored during the diagnostic testing.

* * * * *